United States Patent
Sutskover et al.

(10) Patent No.: US 7,773,962 B2
(45) Date of Patent: Aug. 10, 2010

(54) METHOD AND APPARATUS FOR EFFICIENTLY APPLYING FREQUENCY CORRECTION

(75) Inventors: Ilan Sutskover, Hadera (IL); Rotem Avivi, Petah-Tikwa (IL)

(73) Assignee: Intel Corporation, Santa Clara, CA (US)

( * ) Notice: Subject to any disclaimer, the term of this patent is extended or adjusted under 35 U.S.C. 154(b) by 593 days.

(21) Appl. No.: 11/520,196

(22) Filed: Sep. 13, 2006

(65) Prior Publication Data

US 2008/0064355 A1    Mar. 13, 2008

(51) Int. Cl.
*H04B 1/40* (2006.01)
*H04B 7/00* (2006.01)

(52) U.S. Cl. .............. 455/130; 455/75; 455/182.1; 455/192.1; 455/255; 455/296

(58) Field of Classification Search .......... 455/67.11, 455/67.13, 75–76, 148, 182.1–182.2, 192.1–192.2, 455/208, 255–265, 315–319, 295–296, 283–285, 455/310

See application file for complete search history.

(56) References Cited

U.S. PATENT DOCUMENTS

| | | | | |
|---|---|---|---|---|
| 5,933,059 A | * | 8/1999 | Asokan | 331/18 |
| 6,064,272 A | * | 5/2000 | Rhee | 331/16 |
| 6,163,710 A | * | 12/2000 | Blaser et al. | 455/552.1 |
| 6,308,049 B1 | * | 10/2001 | Bellaouar et al. | 455/76 |
| 6,836,526 B2 | * | 12/2004 | Rana | 377/47 |
| 6,856,791 B2 | * | 2/2005 | Klemmer | 455/76 |
| 6,914,935 B2 | * | 7/2005 | Eklof | 375/238 |
| 7,039,438 B2 | * | 5/2006 | Khlat | 455/552.1 |
| 7,061,996 B2 | | 6/2006 | Kim | |
| 7,098,749 B2 | * | 8/2006 | Forrester | 331/176 |
| 2006/0093079 A1 | * | 5/2006 | Kim et al. | 375/344 |
| 2006/0245531 A1 | * | 11/2006 | Leonowich et al. | 375/376 |
| 2008/0085693 A1 | * | 4/2008 | Harms | 455/255 |

FOREIGN PATENT DOCUMENTS

KR    10-03455329 B2    12/2000

OTHER PUBLICATIONS

PCT/US2007/078437, "International Preliminary Report on Patentability and Written Opinion received for PCT Patent Application No. PCT/US2007/078437 mailed Mar. 26, 2009", 6 pages.

* cited by examiner

*Primary Examiner*—Simon D Nguyen
(74) *Attorney, Agent, or Firm*—Thorpe North & Western LLP

(57) ABSTRACT

In a structure having a fractional-N synthesizer driven by a voltage controlled oscillator, frequency accuracy is maintained by first using the fractional-N synthesizer to correct large frequency errors and then slowly transferring correction from the fractional-N synthesizer to the voltage controlled oscillator a little at a time.

20 Claims, 3 Drawing Sheets

METHOD AND APPARATUS FOR EFFICIENTLY APPLYING FREQUENCY CORRECTION

TECHNICAL FIELD

The invention relates generally to frequency correction and, more particularly, to techniques for performing frequency correction in systems using fractional-N synthesizers.

BACKGROUND OF THE INVENTION

Wireless communication devices must often synchronize their internal timing mechanisms to signals received from a remote entity (e.g., a base stations, etc.). A wireless standard may specify, for example, a maximum amount of error that may exist between the frequency of a locally generated signal within a wireless device (e.g., a clock, an LO signal, etc.) and the frequency of a received signal (e.g., a signal received from a base station, etc.). To address such requirements, frequency correction strategies may be employed. Techniques are needed for applying frequency correction in an efficient and accurate manner.

DETAILED DESCRIPTION

Figure 1:
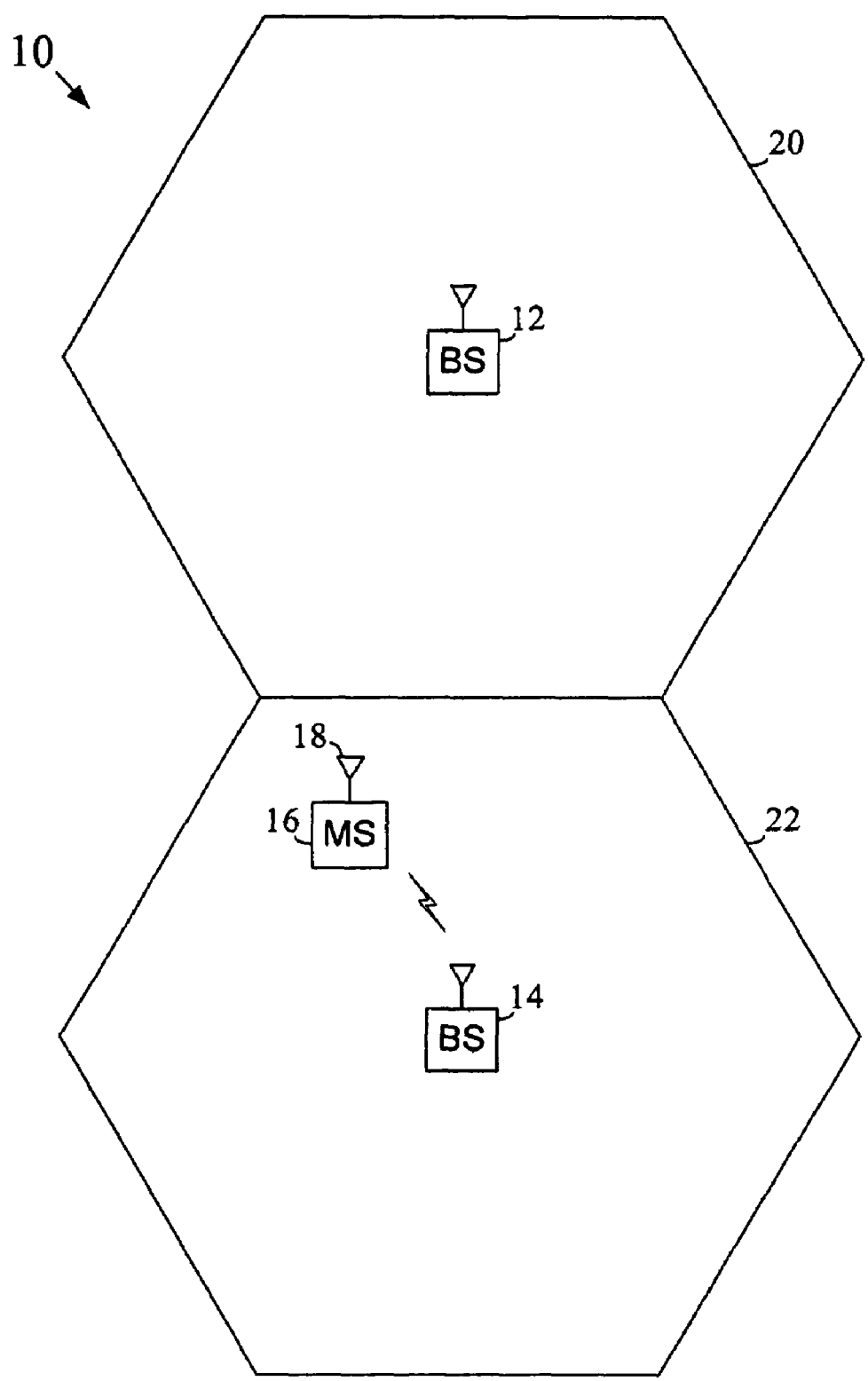
FIG. 1 is a block diagram illustrating an example wireless communication arrangement in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a block diagram illustrating an example wireless communication arrangement 10 in accordance with an embodiment of the present invention. The arrangement 10 may exist within, for example, a wireless communication network (e.g., an IEEE 802.11 based network, an IEEE 802.16 based network, etc.), a cellular telephone network (e.g., a Global System for Mobile Communications (GSM) network, a General Packet Radio Services (GPRS) network, an Enhanced Data for GSM Evolution (EDGE) network, etc.), or other types of networks and systems. As shown, the wireless communication arrangement 10 includes first and second base stations 12, 14. Each base station 12, 14 may have one or more antennas to facilitate the transmission and reception of wireless signals. Each base station 12, 14 has a coverage region or cell 20, 22 within which the base station 12, 14 provides network access services. That is, each base station 12, 14 is capable of supporting wireless links with one or more mobile stations within a corresponding cell 20, 22 to provide network access and communication services for the mobile stations. The base stations 12, 14 may also be able to communicate with one another via wireless and/or wired links between the stations. The base stations 12, 14 may also have access to larger networks such as, for example, the public switched telephone network (PSTN), the Internet, a private local area network (LAN), and/or others. Although the wireless communication arrangement 10 of FIG. 1 is shown as having only two base stations 12, 14, it should be understood that a cellular-type wireless system may include any number of base stations to provide communication coverage over an extended region.

As shown in FIG. 1, the wireless communication arrangement 10 also includes a mobile station 16 that is located within the coverage region 22 of the second base station 14. The mobile station 16 may comprise any type of mobile wireless communication device or system including, for example, a cellular telephone, a portable computer having wireless functionality, a personal digital assistant having wireless functionality, and/or others. The mobile station 16 may include one or more antennas 18 to facilitate the transmission and reception of wireless signals. Any type of antenna(s) may be used including, for example, dipoles, patches, helical antennas, antenna arrays, multi-antenna (e.g., MIMO) arrangements, and/or others. A mobile station 16 will typically associate with a base station within the system that will provide network access for the mobile station. As shown in FIG. 1, the mobile station 16 is currently associated with base station 14. As the mobile station 16 moves around, however, the base station to which it is associated may change. For example, if the mobile station 16 moves from cell 22 into cell 20, the association of the mobile station 16 may change from base station 14 to base station 12. This is referred to as a handoff operation.

While the mobile station 16 is associated with the base station 14, the mobile station 16 must maintain some level of frequency synchronization with the base station 14. Typically, the mobile station 16 will attempt to synchronize to a signal received from the base station 14. In accordance with the GSM cellular standard, for example, a mobile station is required to maintain a frequency accuracy of 0.1 parts-per-million (ppm) with respect to a signal received from an associated base station. Other wireless standards may have different requirements. Techniques for correcting the frequency of an internally generated signal, based on a received signal, are needed that are capable of satisfying such frequency accuracy requirements.

Figure 2:
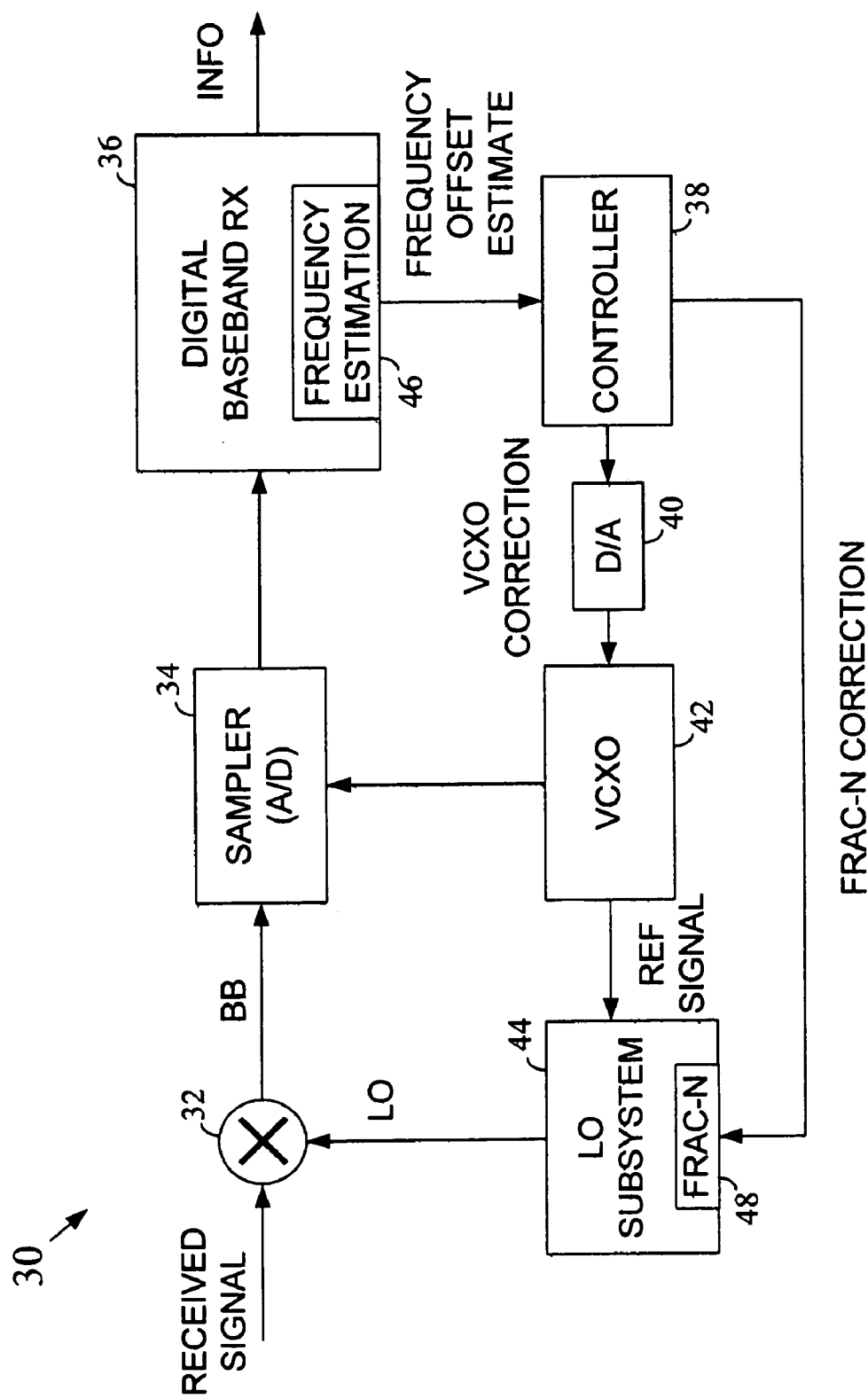
FIG. 2 is a block diagram illustrating an example receiver system in accordance with an embodiment of the present invention.

FIG. 2 is a block diagram illustrating an example receiver system 30 in accordance with an embodiment of the present invention. The receiver system 30 may be used within, for example, the mobile station 16 of FIG. 1 or within other wireless communication devices. As illustrated, the receiver system 30 may include: a mixer 32, a sampler 34, a digital baseband receiver 36, a controller 38, a digital-to-analog (D/A) converter 40, a voltage controlled crystal oscillator (VCXO) 42, and a local oscillator (LO) subsystem 44. The VCXO 42 is operative for generating a reference signal for use by other elements within the system 30. The LO subsystem 44 uses the reference signal output by the VCXO 42 to generate an LO signal for delivery to the mixer 32. The mixer 32 uses the LO signal to down-convert a signal received from a wireless channel (i.e., the received signal) to baseband.

The sampler 34 samples the baseband signal output by the mixer 32 to generate a digital representation thereof. As shown, in at least one embodiment, the reference signal output by the VCXO 42 is used to clock the sampler 34. The reference signal may also be used to clock other circuits and components within the corresponding device or system. The digital samples generated by the sampler 34 are delivered to the input of the digital baseband receiver 36 which digitally processes the samples to extract communication information from them. This extracted information may then be directed to, for example, a user interface or other destination.

As shown in FIG. 2, in at least one embodiment, the digital baseband receiver 36 may include frequency estimation logic 46 that is capable of estimating a frequency offset between the LO signal used by the mixer 32 and the received signal. In at least one embodiment, the frequency estimation logic 46 generates a frequency offset estimate at fixed intervals (e.g., every M frames, etc.). To perform an accurate down-conversion to baseband, the frequency of the LO signal needs to be substantially the same as the frequency of the received signal. The controller 38 receives the frequency offset estimates from the digital baseband receiver 36 and uses the estimates to determine how to adjust the frequency of the LO signal to reduce or eliminate the frequency offset.

As shown in FIG. 2, the LO subsystem 44 may include a fractional-N synthesizer 48. The fractional-N synthesizer 48 represents functionality that allows an output frequency to be achieved that is a non-integer multiple of the frequency of a reference signal applied to an input of the fractional-N synthesizer. Techniques for implementing a fractional-N synthesizer are well-known in the art.

To adjust the frequency of the LO signal, the controller 38 has two options. In a first option, the controller 38 may send a correction signal to the fractional-N synthesizer 48 that will cause the synthesizer 48 to change the non-integer multiplier it is using to generate the LO signal. In another possible option, the controller 38 may deliver a correction signal to the VCXO 42 to change the frequency of the reference signal generated thereby. Any change in the frequency of the reference signal will translate to a change in the frequency of the LO signal. Because the VCXO 42 requires an analog input signal, a D/A converter 40 may be used to convert the digital control signal output by the controller 38 to analog.

The fractional-N synthesizer 48 is capable of adjusting the frequency of the LO signal to a relatively high degree of accuracy. Frequency correction commands sent to the VCXO 42, on the other hand, can result in a much higher level of frequency error. Error levels of up to 30% (or more) overshoot or undershoot in the commanded frequency change are experienced when correction messages are sent to some VCXOs. Therefore, if a relatively large frequency offset is detected, and the VCXO is used to correct for the offset, the resultant frequency error after correction may still be far outside the frequency accuracy requirements of the system (e.g., 0.1 ppm in GSM, etc.). In one possible approach to address this problem, all frequency corrections may be performed using the more accurate fractional-N synthesizer 48. However, as discussed previously, in some embodiments, the VCXO 42 may also provide the clock signal for the sampling function (and possibly other elements) within the corresponding system. Therefore, exclusive use of fractional-N corrections can allow timing errors to accumulate in the system. In accordance with one aspect of the present invention, techniques are provided that are capable of performing frequency correction within a system in a manner that meets prescribed frequency accuracy requirements while also reducing the accumulation of time drift errors in the system.

In at least one embodiment of the invention, when the controller 38 receives a new frequency offset estimate, the controller 38 will immediately send a correction signal to the fractional-N synthesizer 48 in order to correct for the entire offset. Because the fractional-N synthesizer 48 is relatively accurate, the LO frequency will usually have relatively little frequency error after the correction is made and the frequency accuracy requirements of the corresponding wireless standard, if any, will most likely be satisfied. After this initial correction is made using the fractional-N synthesizer 48, the correction may be slowly transferred from the fractional-N synthesizer 48 to the VCXO 42 over time. That is, instead of initially making a large correction to the frequency of the VCXO 42 to correct for the frequency offset, a large correction is first made to the fractional-N synthesizer 48 and then this correction is transferred to the VCXO 42 in small amounts ($\Delta f$) over time. For example, suppose a relatively large frequency offset of 600 Hz is estimated at a particular time (e.g., just after a handoff operation has occurred). A 600 Hz correction can then be made to the LO frequency using the fractional-N synthesizer. The correction can then be transferred from the fractional-N synthesizer 48 to the VCXO 42, at fixed intervals, in 30 Hz increments (for example).

When the controller 38 transfers correction from the fractional-N synthesizer 48 to the VCXO 42, it may send a first correction signal to the VCXO 42 to achieve a frequency change of $\Delta f$ and a second correction signal to the fractional-N synthesizer 48 to achieve a frequency change of $-\Delta f$ (or vice versa). In at least one embodiment of the invention, the intervals at which the controller 38 causes small amounts of correction to be transferred to the VCXO 42 are the intervals at which frequency offset estimates are made. For example, in one possible system, a frequency offset may be estimated once every M (e.g., 16) received frames. In this system, the transfer of correction may also be made once every M frames. In this manner, every time a transfer is made, there will be another frequency offset estimation (and corresponding correction) performed before the next transfer is made.

In at least one embodiment of the present invention, the small amount of correction ($\Delta f$) that is transferred from the fractional-N synthesizer 48 to the VCXO 42 may be selected in a manner that is designed to meet a frequency accuracy requirement of a corresponding system, assuming a worst case correction error in the VCXO 42. For example, in one possible implementation, it may be determined that 10 Hz of frequency error is an acceptable amount that will not cause a receiver to violate a corresponding frequency accuracy requirement (e.g., 0.1 ppm, etc.). It may also be known that the worst case frequency change error of a VCXO being used in the system is +/−30%. The amount of the small correction $\Delta f$ may therefore be set to 10 Hz/0.3=33 Hz or, rounded down, 30 Hz. This number may also be further reduced to provide additional assurance of frequency accuracy.

In one possible approach, the small transfers of correction from the fractional-N to the VCXO are performed until the original correction made to the fractional-N synthesizer has been fully transferred. If additional corrections are made using the fractional-N synthesizer after the initial correction, the small transfers of correction may continue until the sum of all corrections made using the fractional-N synthesizer have been transferred to the VCXO. Some of these corrections may be frequency increases and some may be frequency decreases. In at least one embodiment, the frequency change caused by the VCXO is not allowed to exceed Δf (either an increase or a decrease) at any one transfer. The amount of correction may be less than Δf, however, when, for example, there is less than Δf of accumulated correction to transfer.

Figure 3:
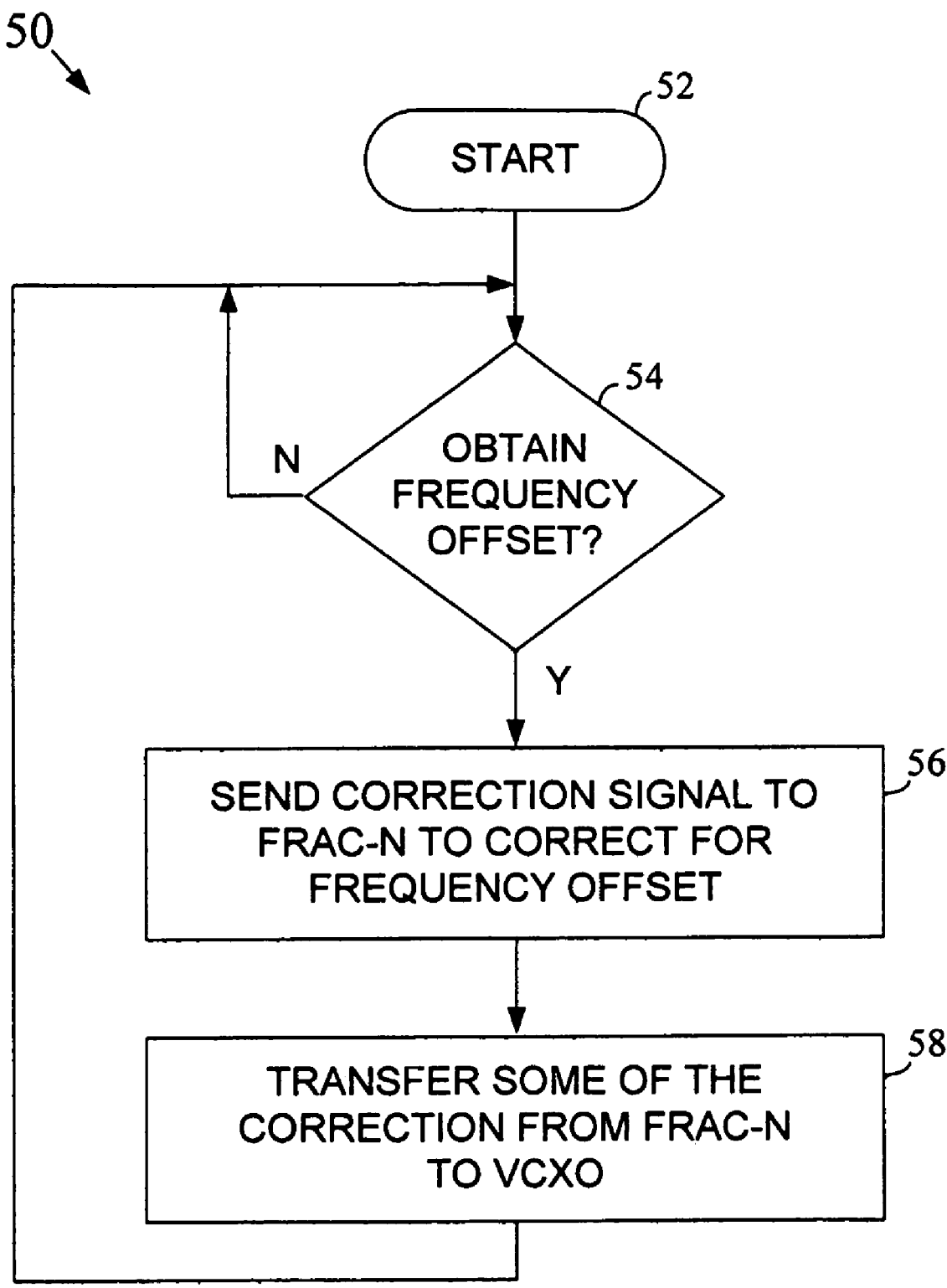
FIG. 3 is a flowchart illustrating an example method for performing frequency correction in accordance with an embodiment of the present invention.

FIG. 3 is a flowchart illustrating an example method 50 for performing frequency correction in accordance with an embodiment of the present invention. The method 50 may be performed in connection with, for example, the receiver system 30 of FIG. 2 or other systems, devices, or components. In at least one embodiment, the method 50 is implemented using software (instructions stored, for example, on a computer readable medium) that can be executed within a digital processing device. The method 50 may initiate when, for example, a system, device, or component is activated (block 52). After initiation, the method 50 may wait for a frequency offset estimate to be obtained (e.g., received from an estimator, etc.)(block 54). In at least one embodiment, the frequency offset estimate may represent an offset between the frequency of a signal received from a wireless channel and the frequency of a locally generated signal (e.g., an LO signal). Frequency offset values may be estimated at pre-specified times (e.g., at fixed intervals, every M received frames, etc.) within a system. When a frequency offset estimate is obtained (block 54-Y), a correction signal may be sent to a local fractional-N synthesizer to correct the frequency of the locally generated signal (e.g., an LO signal), based on the estimated frequency offset (block 56). The correction signal should be sent a relatively short time after the estimate is made as the accuracy of the estimate will typically decrease with time. Because the fractional-N synthesizer is relatively accurate for performing frequency corrections, relatively little frequency offset should exist after this correction is made.

After the fractional-N synthesizer correction has been made, some of the correction may be transferred from the fractional-N synthesizer to the VCXO (block 58). For example, in one approach, a small amount of correction Δf may be transferred from the fractional-N synthesizer to the VCXO, if such a transfer is warranted. Such a transfer may be warranted if, for example, the magnitude of the accumulated amount of correction that was performed by the local fractional-N synthesizer, and that has yet to be transferred to the VCXO, is greater than Δf. The accumulated amount of correction may be the sum of all of the corrections (both positive and negative) done by the fractional-N synthesizer since, for example, initiation. If the magnitude of the accumulated, untransferred correction of the fractional-N synthesizer is less than Δf but more than zero, than that specific amount may be transferred to the VCXO in block 58. The transfer may be a frequency increase or a decrease.

In at least one embodiment, a transfer of correction from the fractional-N to the VCXO may be made whenever the accumulated, untransferred correction of the fractional-N synthesizer is non-zero. A memory location may be allocated to keep track of the amount of accumulated, untransferred correction of the fractional-N synthesizer. In at least one embodiment, the transfer of correction to the VCXO is performed just after the initial correction made in the fractional-N synthesizer (in block 56). As described previously, a transfer of correction of Δf from the fractional-N to the VCXO may be made by changing the frequency of the locally generated signal by +Δf using the VCXO and changing the frequency of the locally generated signal by −Δf using the fractional-N synthesizer (or vice versa). In one approach, blocks 56 and 58 may be effected together by, for example, first changing the frequency of the locally generated signal using the fractional-N by [estimated offset −Δf] and then changing the frequency using the VCXO by +Δf (or vice versa). After the transfer of Δf of correction from the fractional-N synthesizer to the VCXO, the method 50 may return to block 54 and again wait for a frequency offset estimate to be obtained (block 54). When the estimate is received, the corrections may again be performed as described above.

In at least one implementation, the above-described techniques may be used to allow a less expensive voltage controlled crystal oscillator (VCXO) to be used than may previously have been possible, thereby reducing implementation costs. As is known, less expensive oscillators often display higher frequency correction error than do higher cost oscillators. By using the inventive techniques, many of the problems associated with this higher correction error may be overcome. Use of the inventive techniques may, in some cases, increase the amount of time that will elapse before oscillator-caused timing errors are corrected, thus allowing some drift to occur in the sampling clock. However, in some embodiments, this small amount of drift will typically be corrected within the time tracking loop of the digital baseband receiver 36. Although described above in connection with VCXOs, it should be appreciated that aspects of the invention may also be implemented with other types of voltage controlled oscillator (VCO).

In the embodiments described above, the inventive techniques are implemented within communications-based applications. It should be appreciated that aspects of the invention may also be used within non-communications applications to correct the frequencies of locally generated signals. That is, features of the invention may be used whenever an oscillator having a lower frequency correction accuracy is being used to drive a fractional-N synthesizer having a higher frequency correction accuracy.

When implemented within communication systems, the techniques and structures of the present invention may be implemented in any of a variety of different forms. For example, features of the invention may be embodied within cellular telephones and other handheld wireless communicators; laptop, palmtop, desktop, and tablet computers having wireless capability; personal digital assistants (PDAS) having wireless capability; pagers; satellite communicators; cameras having wireless capability; audio/video devices having wireless capability; network interface cards (NICs) and other network interface structures; integrated circuits; as instructions and/or data structures stored on machine readable media; and/or in other formats. Examples of different types of machine readable media that may be used include floppy diskettes, hard disks, optical disks, compact disc read only memories (CD-ROMs), digital video disks (DVDs), Blu-ray disks, magneto-optical disks, read only memories (ROMs), random access memories (RAMs), erasable programmable ROMs (EPROMs), electrically erasable programmable ROMs (EEPROMs), magnetic or optical cards, flash memory, and/or other types of media suitable for storing electronic instructions or data. As used herein, the term "logic" may include, by way of example, software or hardware and/or combinations of software and hardware.

It should be appreciated that the individual blocks illustrated in the block diagrams herein may be functional in nature and do not necessarily correspond to discrete hardware elements. For example, in at least one embodiment, two or more of the blocks in a block diagram may be implemented in software within a single digital processing device. The digital processing device may include, for example, a general purpose microprocessor, a digital signal processor (DSP), a reduced instruction set computer (RISC), a complex instruction set computer (CISC), a field programmable gate array (FPGA), an application specific integrated circuit (ASIC), and/or others, including combinations of the above. Hardware, software, firmware, and hybrid implementations may be used.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A method comprising:
   obtaining an estimate of a frequency offset between a received signal and a locally generated signal;
   after obtaining said frequency offset estimate, using a local fractional-N synthesizer to correct the frequency of the locally generated signal by changing a fractional multiplication value used by the local fractional-N synthesizer based on said frequency offset estimate, said local fractional-N synthesizer being fed by a local voltage controlled oscillator (VCO); and
   transferring some of said correction of said frequency of said locally generated signal from said local fractional-N synthesizer to said local VCO, wherein transferring some of said correction includes changing the fractional multiplication value of said local fractional-N synthesizer in a manner that changes the frequency of the locally generated signal by a first amount and changing an input to said local VCO in a manner that changes the frequency of the locally generated signal by a negative of said first amount.

2. The method of claim 1, further comprising:
   repeating obtaining, using, and transferring at regular intervals, wherein said first amount can change with successive repetitions of obtaining, using, and transferring.

3. The method of claim 1, wherein:
   said first amount has a maximum value of $\Delta f$, wherein $\Delta f$ is selected based on a maximum allowable frequency error.

4. The method of claim 1, wherein:
   said first amount can be positive or negative.

5. The method of claim 1, wherein:
   transferring some of said correction of said frequency of said locally generated signal from said local fractional-N synthesizer to said local VCO includes only transferring correction from said local fractional-N synthesizer to said local VCO when an accumulated, untransferred correction of said local fractional-N synthesizer is non-zero.

6. The method of claim 1, wherein:
   said VCO is a voltage controlled crystal oscillator (VCXO).

7. An apparatus comprising:
   a voltage controlled oscillator (VCO) for generating a reference signal;
   a fractional-N synthesizer for generating a local signal using said reference signal;
   a frequency offset estimator to estimate an offset between a frequency of said local signal and a frequency of a signal received from a communication channel; and
   a controller to adjust said frequency of said local signal by sending control signals to said fractional-N synthesizer and said VCO, wherein said controller, when a frequency offset estimate is received from said frequency offset estimator, sends a control signal to said fractional-N synthesizer to correct the frequency of said local signal by changing a fractional multiplication value used by the local fractional-N synthesizer based on said frequency offset estimate and, at predefined intervals, causes some of said correction to be transferred from said fractional-N synthesizer to said VCO, wherein causing some of said correction to be transferred includes changing the fractional multiplication value of said local fractional-N synthesizer in a manner that changes the frequency of the locally generated signal by a first amount and changing an input to said local VCO in a manner that changes the frequency of the locally generated signal by a negative of said first amount.

8. The apparatus of claim 7, wherein:
   said local signal is a local oscillator (LO) signal used to perform down-conversion.

9. The apparatus of claim 7, wherein:
   said predefined intervals are intervals at which said frequency offset estimator generates frequency offset estimates.

10. The apparatus of claim 7, wherein:
    said controller causes a maximum of $\Delta f$ of correction to be transferred from said fractional-N synthesizer to said VCO for each predefined interval, wherein $\Delta f$ is selected based upon a maximum allowable frequency error.

11. The apparatus of claim 7, wherein:
    said controller will only transfer correction from said fractional-N synthesizer to said VCO during one of said predefined intervals when an accumulated, untransferred correction of said fractional-N synthesizer is non-zero.

12. The apparatus of claim 7, wherein:
    said controller changes said fractional multiplication value used by the local fractional-N synthesizer and causes some of said correction to be transferred from said fractional-N synthesizer to said VCO as part of a common operation.

13. An article comprising a storage medium having instructions stored thereon that, when executed by a computing platform, operate to:
    obtain an estimate of a frequency offset between a received signal and a locally generated signal;
    after said frequency offset estimate is obtained, use a local fractional-N synthesizer to correct the frequency of the locally generated signal by changing a fractional multiplication value used by the local fractional-N synthesizer based on said frequency offset estimate, said local fractional-N synthesizer being fed by a local voltage controlled oscillator (VCO); and
    transfer some of said correction of said frequency of said locally generated signal from said local fractional-N synthesizer to said local VCO, wherein transferring some of said correction includes changing the fractional multiplication value of said local fractional-N synthesizer in a manner that changes the frequency of the locally generated signal by a first amount and changing an input to said local VCO in a manner that changes the frequency of the locally generated signal by a negative of said first amount.

14. The article of claim 13, wherein said instructions further operate to:
obtain, use, and transfer repeatedly at regular intervals, wherein said first amount can change with successive repetitions of said operations to obtain, use, and transfer.

15. The article of claim 13, wherein:
operation to transfer some of said correction includes operation to transfer a maximum of $\Delta f$ of correction from said local fractional-N synthesizer to said local VCO, wherein $\Delta f$ is selected based on a maximum allowable frequency error requirement.

16. The article of claim 13, wherein:
operation to transfer some of said correction is only performed when an accumulated. untransferred correction of said local fractional-N synthesizer is non-zero.

17. A system comprising:
at least one dipole antenna;
a voltage controlled oscillator (VCO) for generating a reference signal;
a fractional-N synthesizer for generating a local signal using said reference signal;
a frequency offset estimator to estimate an offset between a frequency of said local signal and a frequency of a signal received from a wireless channel by said at least one dipole antenna; and
a controller to adjust said frequency of said local signal by sending control signals to said fractional-N synthesizer and said VCO, wherein said controller, when a frequency offset estimate is received from said frequency offset estimator, sends a control signal to said fractional-N synthesizer to correct the frequency of said local signal by changing a fractional multiplication value used by the local fractional-N synthesizer based on said frequency offset estimate and, at predefined intervals, causes some of said correction to be transferred from said fractional-N synthesizer to said VCO, wherein causing some of said correction to be transferred includes changing the fractional multiplication value of said local fractional-N synthesizer in a manner that changes the frequency of the locally generated signal by a first amount and changing an input to said local VCO in a manner that changes the frequency of the locally generated signal by a negative of said first amount.

18. The system of claim 17, wherein:
said predefined intervals are intervals at which said frequency offset estimator generates frequency offset estimates.

19. The system of claim 17, wherein:
said controller causes a maximum of $\Delta f$ of correction to be transferred from said fractional-N synthesizer to said VCO for each predefined interval, wherein $\Delta f$ is selected based upon a maximum allowable frequency error requirement.

20. The system of claim 17, wherein:
said controller will only transfer correction from said fractional-N synthesizer to said VCO during one of said predefined intervals when an accumulated, untransferred correction of said fractional-N synthesizer is non-zero.

* * * * *